United States Patent
Kim et al.

(10) Patent No.: US 7,902,521 B2
(45) Date of Patent: Mar. 8, 2011

(54) METHOD FOR FOCUSING ELECTRON BEAM IN ELECTRON COLUMN

(75) Inventors: Ho Seob Kim, Chonan-si (KR); Seung Joon Ahn, Chonan-si (KR); Dae Wook Kim, Chonan-si (KR); Young Chul Kim, Asan-si (KR)

(73) Assignee: Cebt Co. Ltd., Asan-Si (KR)

( * ) Notice: Subject to any disclaimer, the term of this patent is extended or adjusted under 35 U.S.C. 154(b) by 233 days.

(21) Appl. No.: 12/096,095

(22) PCT Filed: Dec. 5, 2006

(86) PCT No.: PCT/KR2006/005214
§ 371 (c)(1),
(2), (4) Date: Jun. 4, 2008

(87) PCT Pub. No.: WO2007/066961
PCT Pub. Date: Jun. 14, 2007

(65) Prior Publication Data
US 2009/0200482 A1     Aug. 13, 2009

(30) Foreign Application Priority Data
Dec. 5, 2005   (KR) .................. 10-2005-0117335

(51) Int. Cl.
*H01J 37/06* (2006.01)
*H01J 37/12* (2006.01)

(52) U.S. Cl. ............ 250/396 R; 250/310; 250/398; 250/492.2

(58) Field of Classification Search ........... 250/310, 250/396 R, 398, 492
See application file for complete search history.

(56) References Cited

U.S. PATENT DOCUMENTS

| | | | | |
|---|---|---|---|---|
| 5,122,663 A | * | 6/1992 | Chang et al. | 250/310 |
| 5,138,169 A | * | 8/1992 | Yamazaki et al. | 250/398 |
| 5,557,105 A | * | 9/1996 | Honjo et al. | 250/310 |
| 6,909,103 B2 | * | 6/2005 | Platzgummer et al. | 250/492.21 |
| 7,465,922 B1 | * | 12/2008 | McCord | 250/310 |
| 2005/0199820 A1 | * | 9/2005 | Eastham | 250/396 R |
| 2010/0187433 A1 | * | 7/2010 | Eastham | 250/396 R |

* cited by examiner

*Primary Examiner* — Jack I Berman
(74) *Attorney, Agent, or Firm* — John K. Park; Park Law Firm

(57) ABSTRACT

The present invention relates to a method for improving focusing in an electron column that generates an electron beam. The method for controlling the focusing of an electron beam in according to the present invention reduces the spot size of the electron beam when the electron beam reaches a specimen, so that resolution can be increased and the line width of a pattern in a semiconductor lithography process can be reduced, with the result that the performance of the electron can be improved.

8 Claims, 2 Drawing Sheets

[Fig. 1]
— Prior Art —
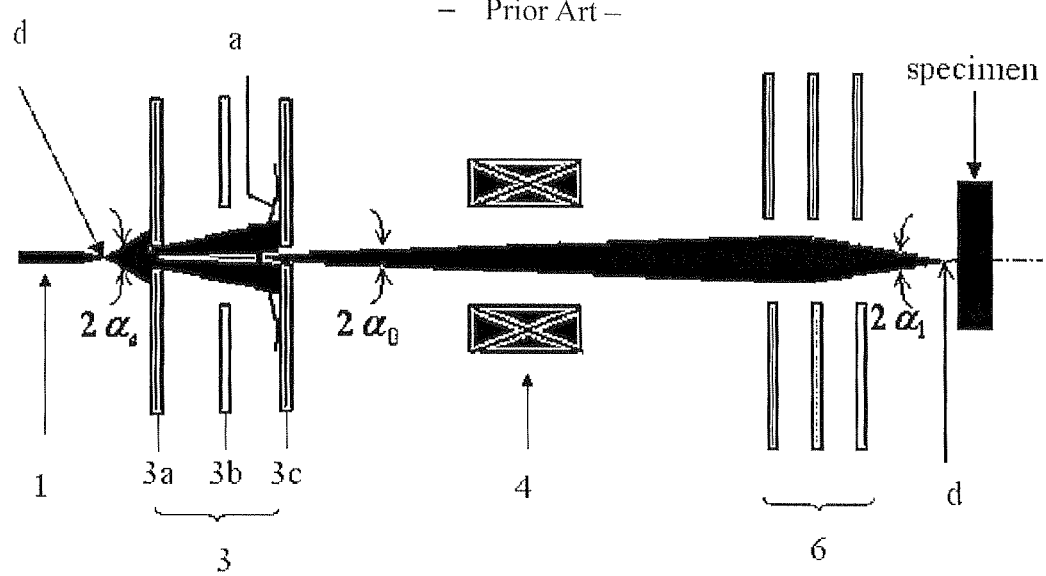
[Fig. 2]
— Prior Art —
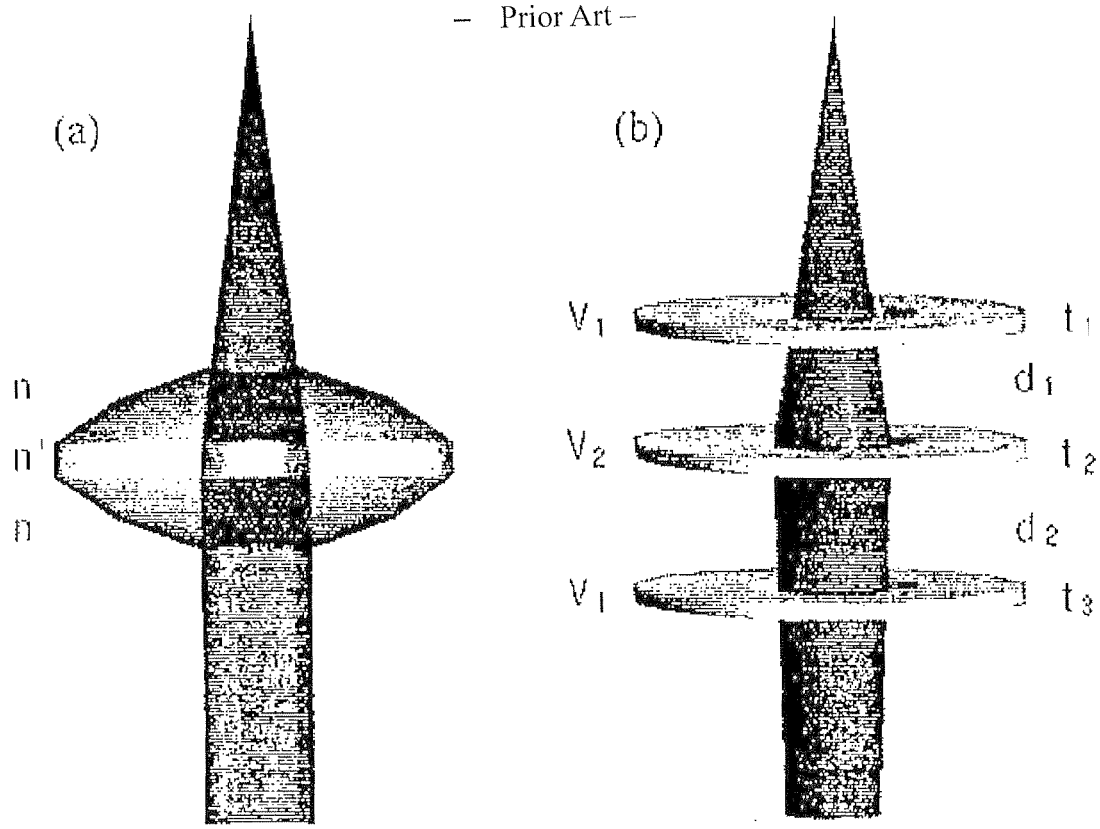

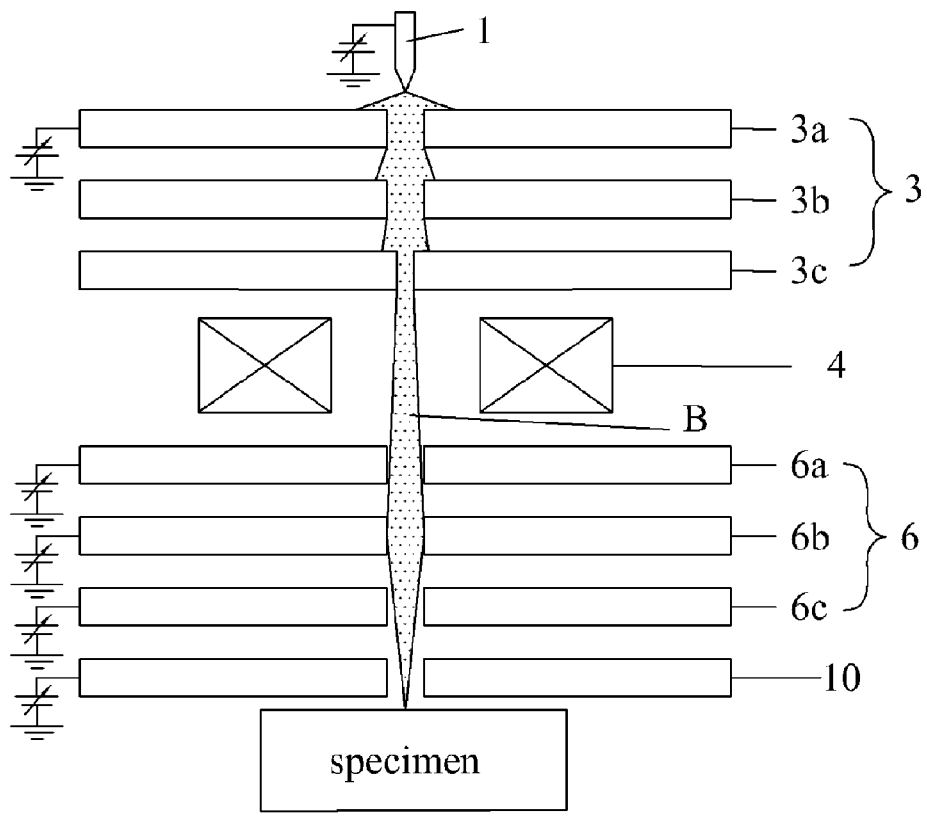
[Fig. 3]
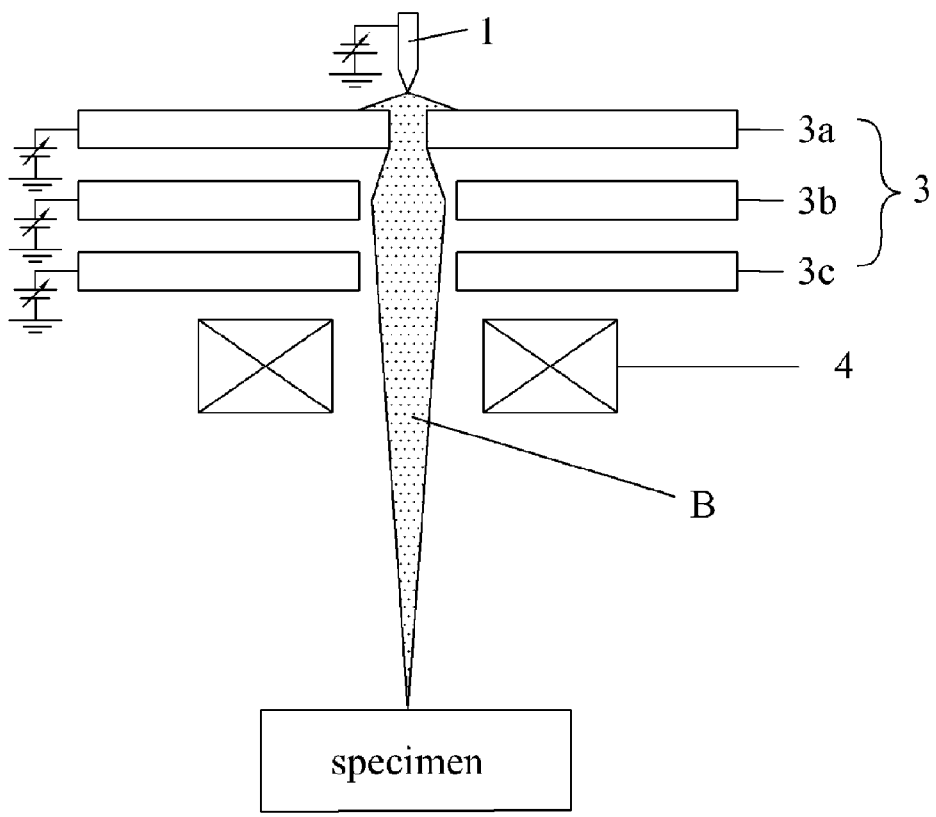
[Fig. 4]

METHOD FOR FOCUSING ELECTRON BEAM IN ELECTRON COLUMN

TECHNICAL FIELD

The present invention relates, in general, to a method for focusing an electron beam in an electron column that generates the electron beam and, more particularly, to a method for increasing the energy of an electron beam while focusing the electron beam in the electron column, so that the spot size of the focused electron beam is further reduced, with the result that precise focusing can be achieved and the energy of the electron beam can be adjusted.

BACKGROUND ART

FIG. 1 shows the structure of a conventional microcolumn, a miniaturized electron column. The electron column includes an electron emitter 1 for emitting electrons, a source lens 3 formed of three electrode layers, that is, an extractor electrode layer 3a, an accelerator electrode layer 3b and a limiting aperture electrode layer 3c, and configured to cause electrons to be emitted from the electron emitter and to effectively form the emitted electrons into a beam, a deflector 4 for deflecting the electron beam, and a focus lens 6 for focusing the electron beam on a specimen. Although the construction of the lenses and the deflector may be modified in various ways as needed, electron columns having the above-described construction are generally used.

In the electron column having the above-described construction, a negative voltage is applied to the electron emitter 1. All of the electrode layers of the source lens 3 may be grounded, or a positive voltage may be applied to the extractor electrode layer 3a, so that electrons can be smoothly emitted from the electron emitter 1. Furthermore, a large negative voltage may be applied to the electron emitter to increase electron beam energy. Furthermore, a negative voltage may be applied to the extractor electrode layer to appropriately maintain the difference in voltage between the electron emitter 1 and the extractor electrode layer 3a. The electrons are emitted according to an electric field formed by the difference between the voltage that is applied to the electron emitter 1 and the voltage that is applied to the extractor electrode layer 3a. The emitted electrons are formed in a manner similar to beam intensity distribution (a), and pass through the accelerator electrode layer 3b and the limiting aperture electrode layer 3c, thus being effectively formed into an electron beam. Generally, the accelerator electrode layer and the limiting aperture electrode are used in a ground state.

The electron beam formed by the source lens 3 is deflected by the deflector 4 and is then focused on a specimen. In the electron column, an Einzel lens is used as a representative focus lens 6. The Einzel lens has a structure in which three electrode layers E1, E2 and E3 are layered.

Furthermore, the last electrode layer of the lens is generally used in a ground state, so that the energy of an electron beam that reaches the specimen is mainly determined by the voltage applied to the electron emitter. That is, the difference between the voltage applied to the electron emitter and the voltage applied to the last electrode layer of the lens (the last electrode layer of the focusing lens) critically affects the electron beam energy of the electron column.

In the elements of the above-described electron column, tungsten is mainly used as material for the electron emitter 1, and a tip, having a pointed end and a radius of several tens of □, is used to obtain the electron beam. Furthermore, a long cylindrical tip is used not only to obtain a stable electron beam, but also to increase the lifespan of the tip. Furthermore, in the microcolumn, the lenses are manufactured through a Micro Electro Mechanical System (MEMS) process.

The spot size, that is, the probe beam size, of an electron beam, which is focused by the electron column that generates the electron beam, is a very important factor in the performance of the corresponding column. The spot size of an electron beam focused on a sample by the electron column is an important factor that determines the resolution of the electron beam in a typical electron microscope, or determines the line width of a pattern, which is formed by the electron beam, in an electron beam lithography.

FIG. 1 shows a diagram of elebron optics by a miniaturized electron column. As shown in FIG. 1, the intensity of the electron beam emitted from the tip is represented by a Gaussian distribution, and the electron beam is broadened at a slightly divergent angle of $\alpha_e$. In this case, only electrons, which are included in the slightly divergent angle, pass through a limiting aperture so as to reduce the diameter of a probe beam and optimally control the beam. $\alpha_0$ is defined as an effective divergent angle. The reason for this is because most of the electrons that have passed through the limiting aperture reach the specimen. The current that flows through the limiting aperture is about 1/10000 of the current emitted from the tip. The reason for this is because the radius of the limiting aperture is very small, about several micrometers. The electrons that have passed through the limiting aperture have electron-electron scattering while passing through a narrow space, and thus the energy broadening of the electron beam occurs.

The electrons that have passed through the limiting aperture pass through the deflector, in which a deflection-aberration occurs. Since such a deflection-aberration is relatively unimportant compared to other aberrations, it is frequently excluded from calculations. The electrons finally pass through the Einzel lens. The Einzel lens functions as a convex lens that converges light in an optics system. Accordingly, the electron beam that has passed through the lens reaches the sample within the range of a slightly divergent angle of $\alpha_1$. In the process of convergence of the electron beam by the lens, a chromatic aberration and a spherical aberration occur as in the optics system, and a coma is created because the electrostatic lenses are not arranged parallel to each other.

Accordingly, minimizing the chromatic aberration and minimizing the diameter of the probe beam depending on the contraction of each of the lenses are the major factors in the design of the electron column.

The diameter of the probe beam must be minimized to perform a precise process using an electron beam. However, there are limitations in the ability to reduce the diameter of the probe beam due to various factors. The greatest of the various factors is aberrations, and other factors include electron-electron scattering between electrons, distortion caused by the deflector, diffractions and the like. Such aberrations are classified into a chromatic aberration, a spherical aberration and a coma. The chromatic aberration and the spherical aberration are generated by each lens, which is one major problem that must be solved to improve the characteristics of the probe beam.

The lenses of the electron column are important in relation to the above-described characteristics of the probe beam. The electrostatic lens affects the moving trajectory of the electrons in the same manner as an optics lens that affects the path of light.

FIG. 2(*a*) shows the state in which light is converged by an optics convex lens, and FIG. 2(*b*) shows the state in which an electron beam is converged by the electrostatic lens. In the case of the optics lens, the light is refracted or converged by passing through media having different refractive indices. In the case of the electrostatic lens, the electron beam is refracted by the potential difference generated by the same medium. The optics lens is made of a single material having a constant refractive index and keeps the velocity of the light constant. In contrast, the electrostatic lens causes continuous variation in velocity of the electrons while the electrons pass through the lens because the curvature of the equipotential surface thereof varies.

Generally, the electrostatic lens includes two or more circular electrode plates, and operates in such a way to form an electric field between the electrode plates by applying voltages to the electrodes and to control the movement of an electron beam. In particular, as shown in FIG. 2(b), in case the electrostatic lens include three electrodes and is designed such that the energy of the electrons entering the lens and the energy of the electrons passing through the lens are kept constantly by applying the same voltage to two end electrodes, it is called an Einzel lens. When the voltage applied to the two end electrodes of the Einzel lens is V1, and the voltage applied to the central electrode of the Einzel lens is V2, the lens enters into retarding mode if V1>V2, and the lens enters into accelerating mode if V1<V2.

The focus lens is important in relation to the spot size of the electron beam emitted from the electrostatic lens of the above-described electron column to the specimen.

Generally, in the electron column, focusing is performed using the focus lens, such as the Einzel lens. The retarding mode or the accelerating mode is mainly used to perform focusing when the Einzel lens is used in a electron column. In the Einzel lens, the upper and lower electrode layers E1 and E3 thereof are grounded and a voltage is applied only to the intermediate electrode layer E2, and thus the Einzel lens enters into the retarding mode or the accelerating mode. Accordingly, in the retarding mode, a negative voltage, which is lower than that applied to the upper and lower electrode layers E1 and E3, is applied to the intermediate electrode layer E2. In the accelerating mode, a positive voltage, which is higher than that of the upper and lower electrode layers E1 and E3, is applied to the intermediate electrode layer E2.

As described above, in the conventional focusing method in the electron column, the upper and lower electrode layers E1 and E3 are grounded and a necessary voltage is applied to the intermediate electrode layer E2, and thus the operation of the electron column is convenient. However, the electron beam that reaches the specimen has a large spot size, so that the method is disadvantageous in that it is difficult to use it to perform a high resolution patterning process, or to use it in an electron beam lithography.

DISCLOSURE OF INVENTION

Technical Problem

Accordingly, the present invention has been made keeping in mind the above problems occurring in the prior art, and an object of the present invention is to provide a method for performing focusing while increasing the energy of an electron beam, which passes through the focus lens, by applying a voltage (or floating voltage) to each of the electrodes of a focus lens formed of two or more layers, thus enabling more precise focusing.

Technical Solution

In order to accomplish the above object, the present invention provides a method for focusing an electron beam in an electron column, comprising applying a positive voltage to each of the electrode layers of a focus lens; and additionally applying a voltage, which is necessary for retarding mode or accelerating mode, to a corresponding electrode layer.

The method according to the present invention allows electron beam energy to be kept constant by applying the voltage of an electron emitter within a stable range in the electron column and causing an electron beam to be emitted from the electron emitter, and causes an electron beam, which passes through a source lens, to have high energy by applying an applicable high voltage to each of the electrode layers of the focus lens. Furthermore, because the same basic voltage is applied to each of the layers of the focus lens and because the originally required voltage or current is additionally provided to the focus lens, the performance of the electrostatic lens is improved. That is, when the same positive voltage is applied to each of the layers of the focus lens, and the energy for retarding mode or accelerating mode is additionally applied to the electrode of an intermediate electrode layer, the intensity of the electrostatic (or electromagnetic} field formed in the focus lens is further increased, so that a constant electrostatic field can be formed, therefore the performance of the lens is improved. Furthermore, the electron beam, which passes through the focus lens, is affected by the more constant electrostatic field formed in the focus lens as the energy thereof increases, and the motion caused by the electrostatic field is reduced, so that focusing can be more precisely adjusted. The same voltage is applied to the focus lens, so that the influence caused by the control voltage of the intermediate electrode layer can decrease, therefore more precise control is possible, and the electrostatic field formed in the focus lens is kept more constant and has relatively little influence out of the exterior. Furthermore, the energy of the electron beam increases, so that the influence of the voltage of the intermediate electrode layer decreases further, therefore a refracting angle that depends on the adjustment of the voltage of the intermediate electrode layer decreases and more precise focusing is performed. As a result, the size of the electron beam that reaches a specimen can be decreased, and the energy thereof can be increased.

That is, the method is implemented in such a way that a voltage for obtaining necessary final energy is applied to each of the first lens layer, the second lens layer and the third lens layer of the focus lens in order to freely adjust the energy required when the electron beam reaches the specimen, and a voltage for focusing is additionally applied to the second layer.

In this method, it is preferred that the focus lens be floated in consideration of the complexity of the electron column and the control of the electron beam.

In order to allow the specimen to be observed in the electron column, an electron beam detector may be necessary. Generally, an SE-detector, MCP, a Back-Scattering Electron (BSE) detector or a semiconductor detector is used as a detector for detecting secondary electrons and/or BSEs. Such a detector uses a high voltage and electrons are emits in a ground state, so that variation in electron beam energy can occur. The electron detector has small affects electron beam energy when detecting electrons in the lateral direction of the electron column. In contrast, the electron detector has large affects the electron beam energy when detecting electrons at a location very close to the electron column or on the same axis as the electron column. In an electron beam lithography, the detector observes the specimen in the electron column and is moved from the axis of the electron column to the side, so that the electron beam energy is not can be changed during the lithography. In this case, the same voltage as the voltage applied to the focus lens is also applied to the detector, so that the voltage potential of the focus lens and the voltage potential of the detector are the same as or similar to each other, therefore variation in energy can be minimized. In this case, an additional electron control device (element) may be necessary.

ADVANTAGEOUS EFFECTS

When the focusing control method for an electron column according to the present invention is used, an electron beam that reaches to the specimen has a small spot size, so that there are advantages in that resolution can be improved in the case where the electron column is used for an electron microscope, and in that the working distance can also be increased. Furthermore, in an electron beam lithography, the width of a pattern can be further reduced and the depth of the pattern can be increased, therefore improved patterning can be performed.

When the focusing control method for an electron column according to the present invention is used, desired electron beam energy can be achieved without applying an additional high voltage to the electron emitter, so that damage to the tip of the electron emitter does not occur and the cost of maintaining ultrahigh vacuum is also reduced.

BRIEF DESCRIPTION OF THE DRAWINGS

FIG. 1 is a sectional view schematically showing the structure of a microcolumn;

FIG. 2 is a conceptual diagram showing the state in which light is condensed by an optics lens and the state in which an electron beam is condensed by an electrostatic lens;

FIG. 3 is a schematic sectional view illustrating a method for focusing an electron beam in an electron column according to the present invention; and FIG. 4 is a schematic sectional view illustrating another method for focusing an electron beam in an electron column according to the present invention.

MODE FOR THE INVENTION

An embodiment of the present invention is described with reference to the accompanying drawings below.

FIG. 3 shows an embodiment to which a method for focusing an electron beam according to the present invention is applied, in which the electron beam is controlled in the typical electron column.

When a negative voltage ranging from several hundreds of eV to several KeV is applied to an electron emitter 1, and a voltage higher than that applied to the electron emitter is applied to the extractor electrode layer 3a of a source lens 3, electrons are emitted from the electron emitter and move to the extractor electrode layer to which the high voltage is applied. For example, when a voltage of −500 eV is applied to the electron emitter 1, electrons are emitted from the electron emitter 1 in such a way that a voltage (for example, −200 eV or +200 eV) higher than that applied to the electron emitter is applied to the extractor electrode layer 3a. The emitted electrons are accelerated, or are accelerated and focused, by an accelerator electrode 3b, and then pass through a limiting aperture electrode layer 3c, and thus the shape of the electron beam is determined. Although a voltage may be applied to the lens layers when needed, a ground voltage is generally applied to the lens layer 3b and the lens layer 3c.

The electron beam that has passed through the limiting aperture electrode layer 3c is deflected by a deflector 4 and is focused on a specimen by a focus lens 6. By the electron beam, secondary electrons from the specimen are generated. Secondary electrons and/or backscattered electrons are detected by a detector. As a result, the image of the specimen can be obtained. In this case, although the detector may be located on the same axis as the lenses, the detector may be independently located, or may be located in various ways according to the characteristics of the detector. That is, although it is possible to use a detector that can be arranged on the same axis as that of the Backscatter Electron (BSE) detector, the detector may be located outside the path along which an electron beam travels through the lenses, as in a Microchannel Plate (MCP) or other detectors, or in a lateral direction relative to the path.

The energy of the electron beam that reaches the specimen is generally determined by the difference in voltage between the electron emitter 1 and the last lens layer 6c of the electron column. The last lens layer 6c is grounded, that is, a voltage of 0V is applied to the last lens layer 6c. FIG. 3 shows a state in which a separate lens layer or electrode layer 10 is further installed below the focus lens 6 to apply an additional voltage. In this case, the electrode layer 10 is related to a voltage applied to the last layer (for example, reference numeral 6c) of the lens, and is used when it is necessary to provide additional energy to the electron beam or when it is necessary to increase or vary the energy of the electron beam while the electron beam approaches the specimen. Whether to use the electrode layer is determined as needed.

The energy of the electron beam that reaches the specimen is determined by the difference in voltage between the electron emitter and either the last lens layer or the additional electrode of the electron column, and a voltage ranging from several hundreds of eV to 2 KeV is applied to the electron emitter, so that, when 0V or a positive voltage higher than 0V is applied to the last lens layer or the additional electrode, the energy of the electron beam can be increased.

In the present invention, voltages are applied to the three lens layers 6a, 6b and 6c of the focus lens 6, respectively. In FIG. 3, the final energy of the electron beam may vary according to the voltage applied to the electrode layer 10. As described above, the electrode layer 10 is used as needed, and a voltage is applied to the electrode layer through calculation of a desired energy. If a detector, which is used as the electrode layer 10 and to which a voltage is applied, is disposed at the location of the electrode layer 10 of FIG. 3, it is possible to use the detector.

In another embodiment of the present invention, shown in FIG. 4, the focus lens part does not exist separately. When it is necessary to increase the energy of an electron beam while focusing is performed by applying a voltage necessary for focusing to an extractor in a source lens part, a voltage is applied to all source lens layers 3a, 3b and 3c, or is selectively applied to desired layers 3b and 3c or to a desired layer 3c, and thus the energy can vary. In this case, a necessary voltage may also be applied to the deflector. In the above-described embodiment of FIG. 4, when the same high voltage is additionally applied to the entire lens part and when voltages necessary for the source lens and for focusing are applied to the respective layers, the total energy of an electron beam that passes through the lens increases, and an electric field for focusing is kept constant due to relatively little influence from the exterior, so that the same effects as for the embodiment of FIG. 3 can be obtained.

That is, the same positive voltage is additionally applied to each of the layers of the lens, which is responsible for focusing, regardless of the location of the lens for focusing, so that an electric field for focusing can be formed and be kept more constant, and the energy of the electron beam can also be increased. If a separate positive voltage is additionally provided to increase the total energy of the electron beam when a separate lens layer or another element exists below the focusing lens, the energy of the electron beam that reaches the specimen increases, therefore a pattern that has a relatively small line width and is deep can be obtained when the pattern is formed in an electron beam lithography.

Although the above description has been made based on a single-type electron column, a multi-type electron column may also adjust the energy of an electron beam in the same manner.

In the case of the multi-type electron column, a unit electron column, corresponding to the construction of the single electron column, may be arranged in n×m arrayed column form, and an additional voltage may be applied to an electrode or lens (layer) that must be additionally provided in the same manner as an existing control method. The additionally provided electrode may be controlled in an existing multiple electron-columns control method in order to adjust the electron beam energy.

INDUSTRIAL APPLICABILITY

In the method for focusing an electron beam in an electron column according to the present invention, the electron column may be used in an electron beam lithography process and the like.

The invention claimed is:

1. A method for focusing an electron beam in a microcolumn comprising an electron emitter, a source lens, one or more deflectors, and a focus lens having a plurality of electrode layers, the method comprising steps of:
applying a predetermined positive voltage, which corresponds to energy of the electron beam emitted from the electron column, to all the plurality of electrode layers of the focus lens; and
applying one or more additional voltages different from the predetermined positive voltage to one or more intermediate electrode layers of the plurality of electrode layers of the focus lens for a retarding mode or an accelerating mode for focusing the electron beam without changing the energy of the electron beam determined by the voltage difference between the predetermined positive voltage and a negative voltage applied to the electron emitter.

2. The method according to claim 1, further comprising additionally a step of applying a voltage to the electrode layers so that the electron beam that finally reaches a specimen can have a desired energy so as to freely adjust the energy of the electron beam when the electron beam reaches the specimen.

3. The method according to claim 1, further comprising additionally a step of providing a necessary voltage for a source lens so that the electrode layers also function as the source lens.

4. The method according to claim 2, further comprising additionally a step of providing a necessary voltage for a source lens so that the electrode layers also function as the source lens.

5. The method according to claim 1, wherein the microcolumns are arranged in m×n arrayed column form.

6. The method according to claim 2, wherein the microcolumns are arranged in m×n arrayed column form.

7. The method according to claim 3, wherein the microcolumns are arranged in m×n arrayed column form.

8. The method according to claim 4, wherein the microcolumns are arranged in m×n arrayed column form.

* * * * *